United States Patent
Barlaz et al.

(10) Patent No.: US 12,461,034 B2
(45) Date of Patent: Nov. 4, 2025

(54) IN-SITU FLUORESCENCE-BASED CHAMBER AND WAFER MONITORING

(71) Applicant: Tokyo Electron Limited, Tokyo (JP)

(72) Inventors: David Eitan Barlaz, Albany, NY (US); Scott Lefevre, Albany, NY (US); Joshua Larose, Albany, NY (US); Henry Puretz, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 143 days.

(21) Appl. No.: 18/478,954

(22) Filed: Sep. 29, 2023

(65) Prior Publication Data

US 2025/0110055 A1 Apr. 3, 2025

(51) Int. Cl.
*G01N 21/64* (2006.01)
*G01N 21/01* (2006.01)
*H01L 21/66* (2006.01)
*H01L 21/67* (2006.01)
*H01L 21/687* (2006.01)

(52) U.S. Cl.
CPC ......... *G01N 21/6489* (2013.01); *G01N 21/01* (2013.01); *G01N 21/6445* (2013.01); *H01L 21/67253* (2013.01); *H01L 21/68742* (2013.01); *H01L 22/12* (2013.01)

(58) Field of Classification Search
CPC ......... H01L 21/67253; H01L 21/68742; H01L 22/12; G01N 21/6489; G01N 21/01; G01N 21/6445
See application file for complete search history.

(56) References Cited

U.S. PATENT DOCUMENTS

| | | | |
|---|---|---|---|
| 4,713,140 A * | 12/1987 | Tien | G01B 11/0658 118/712 |
| 4,846,920 A * | 7/1989 | Keller | H01J 37/32935 216/60 |
| 5,940,175 A * | 8/1999 | Sun | G01N 21/9501 356/237.3 |
| 5,969,805 A | 10/1999 | Johnson et al. | |
| 6,429,928 B2 | 8/2002 | Johnson et al. | |
| 6,509,960 B2 | 1/2003 | Johnson et al. | |
| 6,611,576 B1 | 8/2003 | Besser et al. | |
| 6,798,513 B2 | 9/2004 | Abraham | |
| 6,954,267 B2 | 10/2005 | Abraham et al. | |
| 9,897,539 B2 * | 2/2018 | Kang | G01F 1/00 |
| 2001/0046043 A1 | 11/2001 | Johnson et al. | |
| 2003/0193660 A1 | 10/2003 | Abraham | |

(Continued)

OTHER PUBLICATIONS

International Search Report and Written Opinion of the International Search Authority issued Oct. 30, 2024 in PCT/US2024/039771, 11 pages.

*Primary Examiner* — Sang H Nguyen
(74) *Attorney, Agent, or Firm* — Oblon, McClelland, Maier & Neustadt, L.L.P.

(57) ABSTRACT

A system and a method directed to a monitoring system of semiconductor processing chambers is provided. In particular, monitoring of any chemical formation on a chamber and a wafer of a semiconductor processing chamber using in-situ laser induced fluorescence is provided. The monitoring system and method detect issues before they become a problem for the semiconductor processing chambers by providing diagnosis on chamber health and mechanisms for associated process shifts with a faster turnaround time.

21 Claims, 7 Drawing Sheets

(56) References Cited

U.S. PATENT DOCUMENTS

| | | |
|---|---|---|
| 2004/0253824 A1 | 12/2004 | Tegeder |
| 2011/0049100 A1 | 3/2011 | Han et al. |
| 2012/0243573 A1* | 9/2012 | Matsudo .................. G01K 5/48 |
| | | 118/712 |
| 2014/0332498 A1 | 11/2014 | Han et al. |
| 2015/0243476 A1* | 8/2015 | Lagana-Gizzo .... H01J 37/3005 |
| | | 250/492.21 |
| 2016/0293502 A1* | 10/2016 | Pirkle ..................... H01L 22/12 |
| 2021/0327045 A1 | 10/2021 | Moriya et al. |

* cited by examiner

IN-SITU FLUORESCENCE-BASED CHAMBER AND WAFER MONITORING

TECHNICAL FIELD

The present disclosure is directed to a monitoring system of semiconductor processing chambers, more particularly, monitoring of any chemical formation on a chamber and a wafer of a semiconductor processing chamber using in-situ laser induced fluorescence.

BACKGROUND

The background description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Semiconductor-driven technology has grown considerably and transformed society in recent times. In the manufacture of a semiconductor processing chamber (especially on the microscopic scale), various fabrication processes are executed such as film-forming depositions, etch mask creation, patterning, material etching and removal, and doping treatments. Semiconductor manufacturing has made enormous improvements in production, resulting in improved quality, speed, and performance of the final product. However, the demand for higher speed, higher reliability, and higher performance semiconductors continues. In order to support these requirements, better monitoring and/or inspection systems and methods are continually being sought.

SUMMARY

In an exemplary embodiment, a monitoring system is disclosed; the monitoring system comprising a laser source configured to deliver a laser light to a point on the surface inside a semiconductor processing chamber; a fiber optic configured to monitor a fluorescence induced from the delivered laser light at the point on the surface inside the semiconductor processing chamber; a detector configured to detect the fluorescence, wherein a first end of the detector is connected to a first end of the fiber optic; a computer module configured to provide an analysis of the detected fluorescence, wherein the computer module is connected to a second end of the detector; and wherein the analysis provides a measurement of a deposition at the point on the surface inside the semiconductor processing chamber.

The foregoing general description of the illustrative embodiments and the following detailed description thereof are merely exemplary aspects of the teachings of this disclosure, and are not restrictive.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

In the drawings, like reference numerals designate identical or corresponding parts throughout the several views. Further, as used herein, the words "a," "an" and the like generally carry a meaning of "one or more," unless stated otherwise. Furthermore, the terms "approximately," "approximate," "about," and similar terms generally refer to ranges that include the identified value within a margin of 20%, 10%, or preferably 5%, and any values therebetween.

The following disclosure provides many different embodiments, or examples, for implementing distinctive features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the numerous examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the distinctive features, techniques, configurations, etc. herein may be discussed in various places of this disclosure, it is intended that each of the concepts can be executed independently of each other or in combination with each other. Accordingly, the present invention can be embodied and viewed in many different ways.

As noted in the Background, better monitoring and/or inspection systems and methods are continually being sought by the semiconductor manufacturing industry. The present inventors have recognized, for example, that for semiconductor wafer manufacturers optimizing wafer chamber performance is crucial to ensure high quality, high yield wafers. The chamber of a semiconductor processing chamber is affected by several causes. Routine checks are performed to check the health of the chamber. The metrics of the chamber are logged during such routine checks. However, existing log data may not predict or even indicate some variables that affect the chamber health. Analyzing variations in chamber performance and quickly recognizing which parameters are drifting over time is the key to assuring the maximum yield from each chamber.

Generally, a chamber surface can dramatically affect semiconductor process performance. For example, a wafer etch process run typically includes a chamber seasoning step which runs an appropriate etch chemistry of a production wafer in order to minimize wafer process shifts that can occur from the transition from a clean chamber to a post processing chamber. As another example, an Electrostatic chuck (ESC) used in a variety of semiconductor processes to hold the wafer during processing may affect the process performed by the chamber. ESCs employ a platen with integral electrodes which are biased with high voltage to establish an electrostatic holding force between the platen and wafer, thereby chucking the wafer. However, chemical modification of the electrostatic chuck (ESC) occurs, which can affect the chamber health over a period of processing time. Still further, foreign materials (FM) often created or converted during processing of the wafer surface or the chamber surface, for example, process of wafer etching during which gasses are added, also affect the chamber health. All these problems may be present long before conventional check metrics can detect them and may eventually result in process shifts/wafer breaks before detection.

The semiconductor processing chamber should be continuously monitored for aforementioned problems. Monitoring the changes from a distinct chemical analysis would be a useful tool to monitor chamber seasoning, conversion of ESC surfaces to chemical modifications before wafer breaks, and backside particles either from incoming wafer contamination or from chamber part breakdown, for example. The present disclosure provides methods and systems for monitoring of wafer and chamber in a semiconductor processing chamber. The embodiments herein disclose a method and a system that can meet such a continuous monitoring need. The embodiments disclosed herein provide monitoring and detailed information of diagnosing chamber health issues and mechanisms for associated process shifts. The embodiments disclosed herein provide coating and cleaning of a physical vapor deposition (PVD) chamber and a chemical vapor deposition (CVD) chamber.

Figure 1:
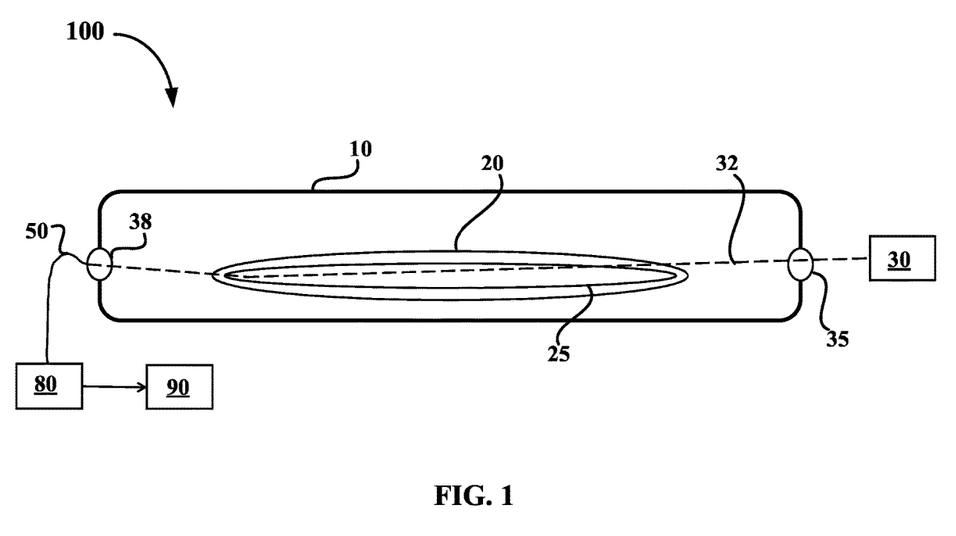
FIG. 1 is an illustration of a monitoring system of the electrostatic chuck (ESC), according to certain embodiments.

Turning to the drawings, FIG. 1 illustrates an example configuration of a monitoring system according to a first embodiment of this disclosure. In the first embodiment, the example configuration is directed to a monitoring system 100 based on laser induced fluorescence on a surface in an area of interest. In FIG. 1, the monitoring system is set up for monitoring an electrostatic chuck (ESC) present inside a semiconductor processing chamber. The ESC is generally exposed to plasma in a fluorine-containing chamber of a semiconductor processing chamber, for example, when an N2 wafer-less treatment is performed to refresh the chuck surface charges. This causes fluorination of the ESC dielectric which creates a conductive surface which can trap charges and cause wafer sticking. Even without a wafer-less plasma treatment, that fluorination can still occur and is seen predominantly at the ESC edge which is generally due to chemical modification over time.

The monitoring system 100 in FIG. 1 comprises a chamber body 10 of a semiconductor processing chamber. Inside the chamber body 10 is an ESC of which generally includes a surface area of interest. In example embodiments herein, an ESC top plate 20 and an elastomer seal band 25 as shown as in FIG. 1 is monitored. A laser 30 is placed on one end of the chamber body 10. Generally, a laser source emitting a wavelength of a range from 126 nm up to 351 nm, with a power consumption of up to 10 W can be used for implementation of the embodiments disclosed herein. The laser 30 emits a laser light 32 that travels into the chamber body 10 through an optical viewport 35. It is to be noted that the laser travels through the ESC top plate 20 such that a laser induced fluorescence occurs at a surface spot of interest. For example, the chuck side inside the elastomer seal band 25 of the ESC which is known to be an area to get affected.

As light emitted from a laser source travels through a surface, such as, for example, the contaminated part of the ESC, atoms, or molecules on that part of the surface get excited to a higher energy level by absorption of the light emitted from the laser. The excitation of the atoms or molecules is followed by an emission of light from the atoms or molecules, known to those skilled in the art, as laser induced fluorescence. This emitted light from the contaminated surface indicates chemical characteristics of the surface (for example, undesirable fluorination).

Embodiments disclosed herein show the laser induced fluorescence occurring on the ESC top plate 20. On the other end of the chamber body 10, a fiber optic 50 oriented at the same spot on the ESC top plate 20 through another optical viewport 38, collects the fluorescence. In the example embodiment, a detector 80 connected at the end of the fiber optic 50 detects the fluorescence light. Typically, the laser 30 and the detector 80 are mounted on the external ends of the chamber body 10 using motorized mounts. The detector can be one selected from, a CCD detector, a camera, etc.

Generally, a computer module 90 connected to the detector 80 is used to analyze the detected fluorescence and determine chemical composition, for example, such as, oxygen to fluorine ratio on ESC. The laser induced fluorescence collected through the fiber optic 50 can measure chemical compositions of interest. The computer module 90 can also save log data with metrics such as, measured chemical composition of the area of interest at different time intervals indicating the changes in the chemical composition over a period of time with continuous monitoring.

Figure 2:
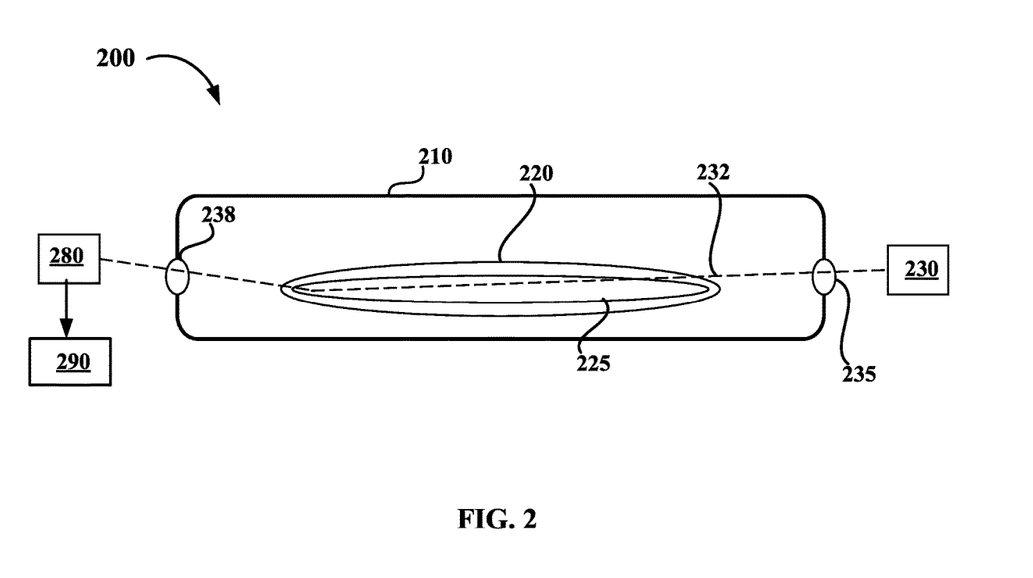
FIG. 2 is an illustration of a monitoring system of the electrostatic chuck (ESC), according to certain embodiments.

In another embodiment, the monitoring system 200 is configured as an in-situ ellipsometer, as illustrated in FIG. 2. The monitoring system 200 in FIG. 2 includes a chamber body 210 of a semiconductor processing chamber with an ESC (top plate 220 and an elastomer seal band 225 as seen in FIG. 2). A laser source 230 is positioned at one end of the chamber body 210. The laser source emits a light 232 that travels through the ESC 220 inside the chamber body 210 through the optical viewport 235. A detector 280 is positioned at the other end of the chamber body 210. The light running through the ESC 220 induces fluorescence which exits the chamber body from another optical viewport 238. This fluorescence and the laser light are detected using the detector 280. The laser source 230 and the detector 280 are mounted on the chamber body 210 using motorized mounts.

It is to be noted that, the positioning of the laser source 230 and the detector 280 with respect to the chamber body 210 and the ESC 220 that is placed inside the chamber body, in the monitoring system 200 in FIG. 2, forms an in-situ ellipsometer. This in-situ ellipsometer on an ESC as described in the embodiments herein provides continuous monitoring of a spot of interest on the ESC for any chemical modification. The fluorescence detected by the detector 280 may be further analyzed by a computer module 290 connected to the detector 280.

Figure 3A:
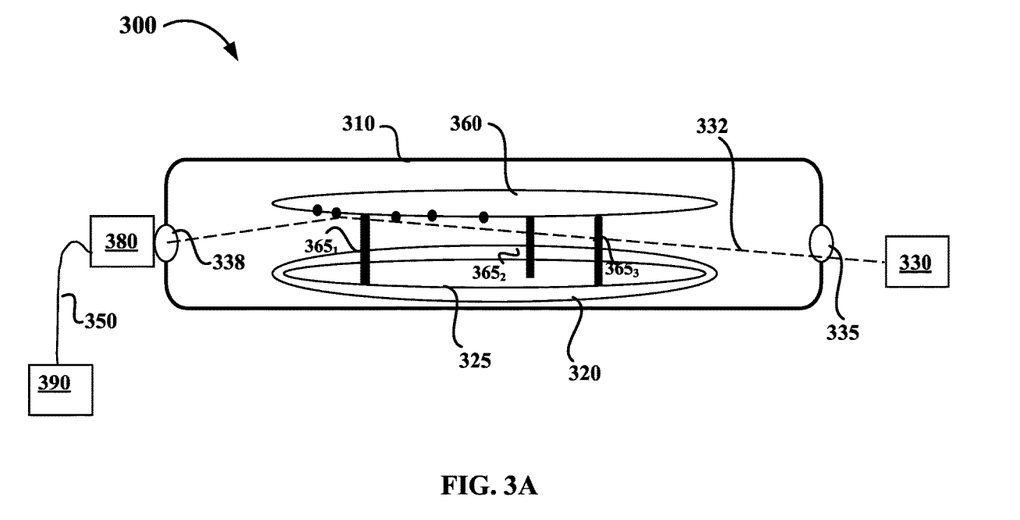
FIG. 3A is an illustration of a monitoring system of the wafer, according to certain embodiments.

In an embodiment of the present disclosure, a monitoring system is set up for monitoring the wafer, more specifically the wafer backside of a semiconductor processing chamber. The monitoring system 300 as shown in FIG. 3A, is provided herein with a chamber body 310 of a semiconductor processing chamber with an elevated wafer 360. A plurality of torque pins, for example, three torque pins $365_{1-3}$ shown in FIG. 3A, are used to elevate a wafer of the semiconductor processing chamber, placed on the ESC top plate 320 with an elastomer seal band 325 inside the chamber body 310. A transfer arm may also be used to elevate the wafer.

Figure 3B:
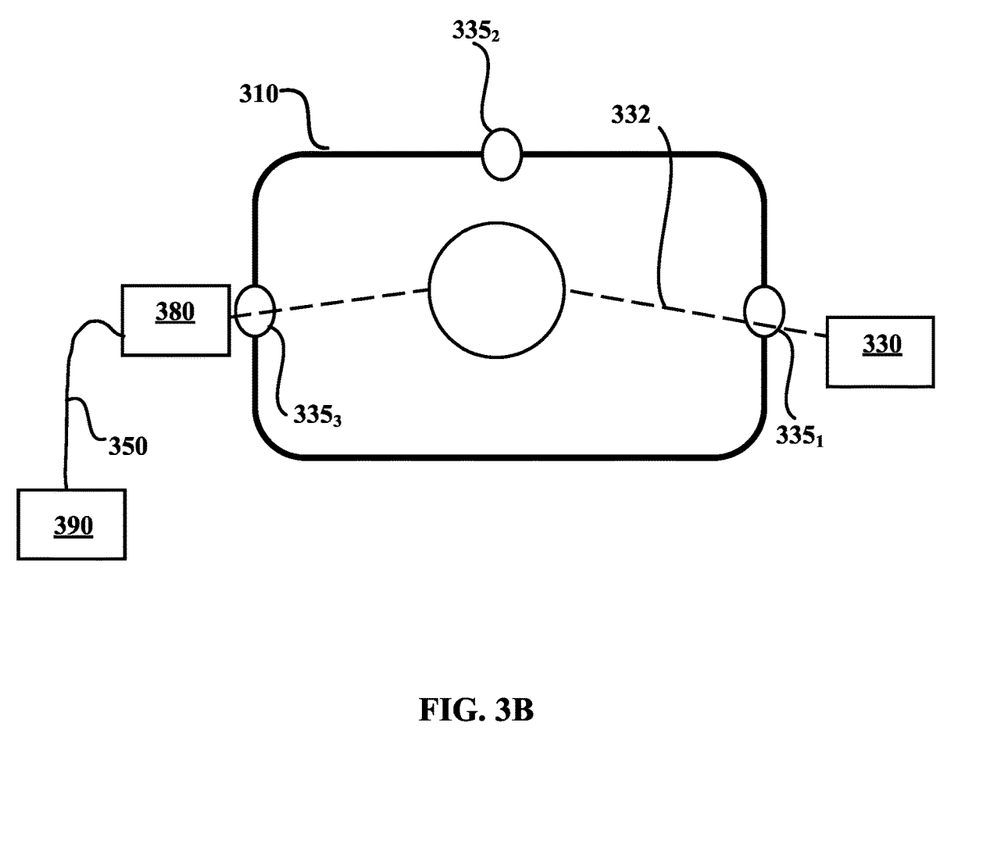
FIG. 3B is a schematic diagram of the top view of the monitoring system illustrated in FIG. 3A.

A laser source 330 is positioned at one end of the chamber body 310. The laser source emits a laser light 332 that travels inside the chamber body 310 through the optical viewport 335. A detector 380 is positioned at the other end of the chamber body 310. Typically, the laser source 330 and the detector 380 are mounted on the chamber body 310 using motorized mounts. It is to be noted that, the laser source 330 and the detector 380 can be positioned at any two of the three existing optical viewports $335_{1-3}$ to avoid specular reflection, as shown in FIG. 3B. Spectral reflection is known to those skilled in the art, as a type of surface reflectance which is defined as a mirror-like reflection of light from a surface.

FIG. 3B shows the top view of a chamber body 310 of a semiconductor processing chamber with three optical viewports (windows) $335_{1-3}$ on a chamber body 310 wherein a laser source 330 emits a laser light 332, being detected with a detector 380 and a computer control 390 using a fiber optic 350. The laser light 332 enters the chamber body 310 herein from the optical viewport $335_1$ and the laser induced fluorescence exits the chamber body from the optical viewport $335_3$.

The laser light 332 travelling inside the chamber body 310 induces fluorescence. This laser induced fluorescence detects chemistry on wafer backside, such as, for example, elastomer particles, Aluminum monofluoride (AlF) transfer, etc. The deposited particles are as shown by black dots on the elevated wafer 360 in FIG. 3A, through which the laser light 332 travels and exits through one of the three optical viewport 338 to be captured by the detector 380.

A fiber optic 350 is used to further connect the detector 380 to a computer control 390. The computer control 390 is used to analyze the detected laser induced fluorescence for any chemical deposition or changes on the wafer backside, which can further be logged using the computer control 390 with continuous monitoring data.

In another embodiment of the monitoring system 300 in FIG. 3A, laser light 332 is scattered by the deposited particles (shown by black dots in FIG. 3A) on the backside of the elevated wafer 360. A detector 380 monitors particle count from the scattered light over a period of time. The computer control 390 logs the particle count to contactless monitor the elastomer seal band 325 degradation over time.

Figure 4A:
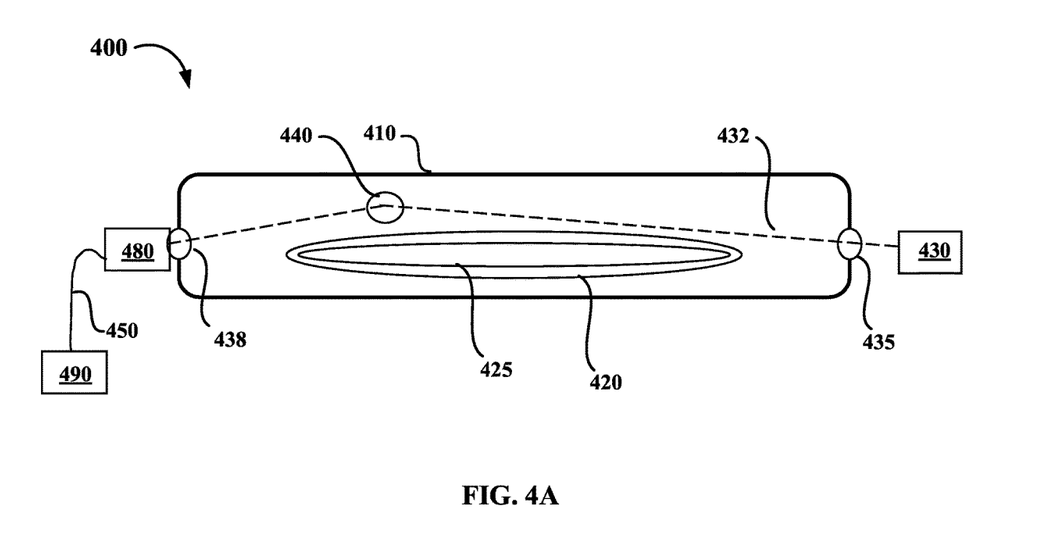
FIG. 4A is an illustration of a monitoring system of the chamber wall, according to certain embodiments.
Figure 4B:
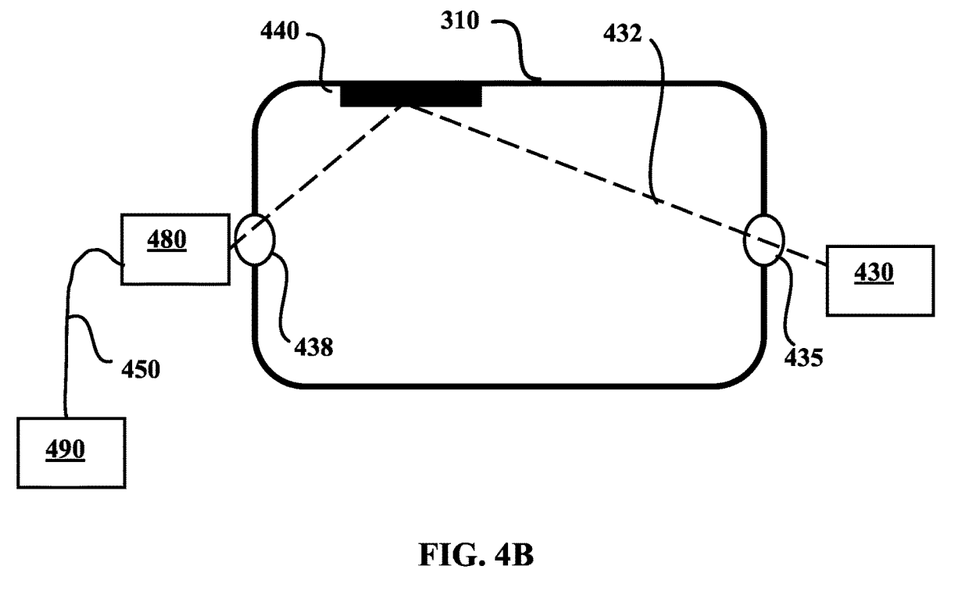
FIG. 4B is a schematic diagram of the top view of the monitoring system illustrated in FIG. 4A.

In an embodiment of the present disclosure, for monitoring the chamber wall, more specifically the chamber side wall, of a semiconductor processing chamber. The monitoring system 400 as shown in FIG. 4A, is provided with a chamber body 410, an ESC top plate 420 with an elastomer seal band 425 inside the chamber body 410 of a semiconductor processing chamber. It is to be noted that, FIG. 4A illustrates the side view of the chamber body 410 of a semiconductor processing chamber. A laser source 430 is positioned at one end of the chamber body 410. The laser source emits a laser light 432 that travels inside the chamber body 410 through the optical viewport 435. A detector 480 is positioned at the other end of the chamber body 410. FIG. 4B shows the top view of the monitoring system 400, monitoring the internal wall 440 of the chamber body 410 of a semiconductor processing chamber. Typically, the laser source 430 and the detector 480 are mounted on the chamber body 410 using motorized mounts which enable to change the position of the laser and detector for monitoring different surface areas of interest or minimizing specular reflection.

The laser light 432 travelling inside the chamber body 410 and incident on the internal wall 440 of the chamber body 410 induces fluorescence. This laser induced fluorescence indicates chemistry on the internal wall 440 of the chamber body 410, such as, for example, contamination on the chamber body internal wall, preclean or precoat on the chamber internal wall, etc., through which the laser light 432 travels and exits through one of the three optical viewport 438 to be captured by the detector 480. A fiber optic cable 450 is used to further connect the detector 480 to a computer control 490. The computer control 490 is used to analyze the detected laser induced fluorescence for any chemical deposition or changes on the internal wall 440 of the chamber body 410, which can further be logged using the computer control 490 with continuous monitoring data.

A first wafer effect refers to the phenomenon where the thickness and the map profile of the first prepared wafer differ from those of the wafer prepared via the continuous process when chemical deposition has started inside the chamber body of a semiconductor processing chamber. Continuous monitoring of the internal wall of the chamber body and regular actions are beneficial in reducing the first wafer effects.

Figure 5A:
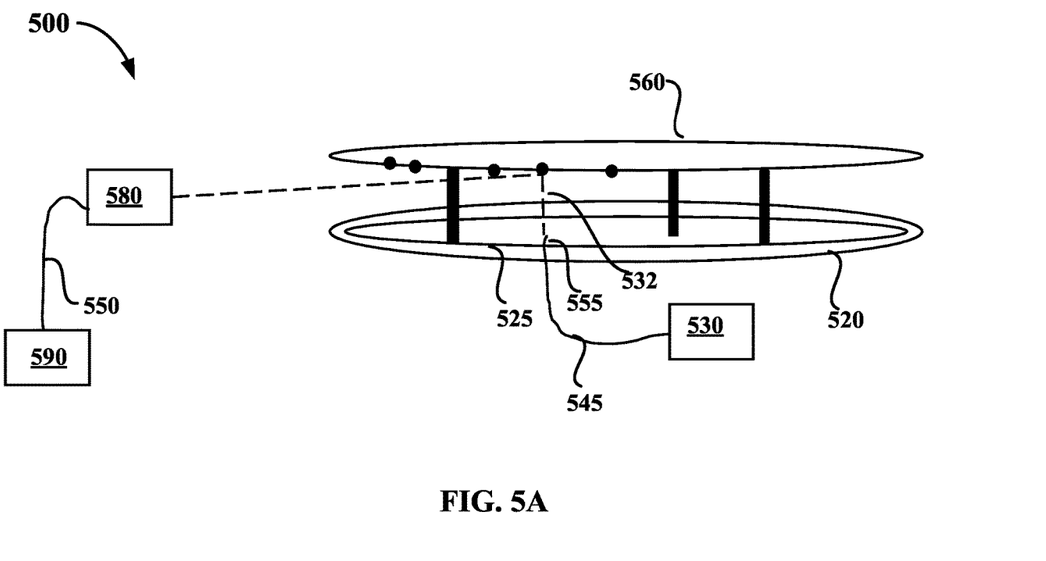
FIG. 5A is an illustration of a monitoring system of the wafer, according to certain embodiments.

In another embodiment of the present disclosure, in a monitoring system 500, the light source can be positioned inside the chamber body of a semiconductor processing chamber, while the detector can be positioned outside the chamber body. In the implementation of such an embodiment as shown in FIG. 5A, the light source 530 is mounted on one end of the chamber body 510. The light source 530 is connected to a fiber optic cable 545. The fiber optic cable 545 carries a light 532 from the light source 530 to a point 555 on the ESC 520. Light 532 is further emitted from this point 555 on ESC 520 to the elevated wafer backside 560, the point 555 on ESC 520 thereby acting as a light source for the current embodiment, as illustrated in FIG. 5A.

Figure 5B:
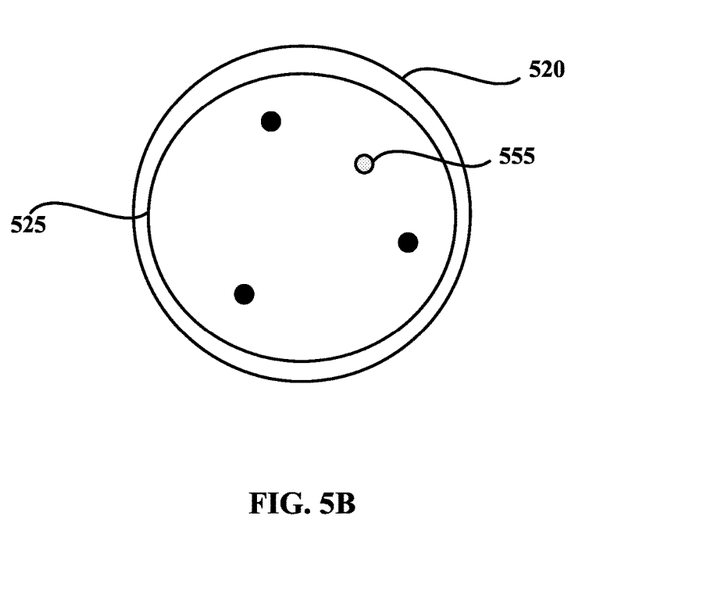
FIG. 5B is a schematic diagram of the top view of the monitoring system illustrated in FIG. 5A.

In the embodiments herein, monitoring inside the chamber body, such as, for example, monitoring the elevated wafer backside, the light 532 emitted from the point 555 on ESC 520 travels to the elevated wafer backside 560. The laser induced fluorescence then travels from the elevated wafer backside 560 up to the detector 580. FIG. 5B shows the top view of the ESC 520 with the point 555 of the light source, as described in the embodiments disclosed in FIG. 5A. In another embodiment, the detector 580 can also be built into ESC 520 with fiber optic 550 angled to view same point 555 as the laser source point on ESC. It is to be noted that, for such an arrangement, specific measures need to be taken with respect to avoiding specular reflection.

Any of the embodiments above can be used to monitor the chamber over time to determine when to run wafer-less clean cycles or when preventative maintenance is required. In addition, any of the embodiments herein can be used to conduct more routine monitoring of wafer backside particle pickup from the elastomer seal, for example. Methods disclosed herein enable to detect issues before they become a problem for process drift, and would give more detailed information for diagnosing chamber health issues and mechanisms for associated process shifts. Further the methods herein could be integrated with a feedback design to improve the stability of processes over time.

Numerous modifications and variations of the present disclosure are possible in light of the above teachings. It is therefore to be understood that within the scope of the appended claims, the invention may be practiced otherwise than as specifically described herein.

The invention claimed is:

1. A monitoring system, comprising:
a semiconductor processing chamber including a surface of an electrostatic chuck (ESC) within the semiconductor processing chamber and a surface of an internal wall of the semiconductor processing chamber;
a laser source configured to provide laser light incident on a surface including one selected from the group consisting of the surface of the ESC, the surface of the internal wall and a surface of a wafer contained in the semiconductor processing chamber to induce fluorescence from the surface;
a light detector configured to detect the fluorescence from the surface, wherein at least one of the laser source and the light detector is provided outside of the semiconductor processing chamber; and
a computer module configured to analyze the fluorescence and determine a chemical characteristic of the surface based on the fluorescence.

2. The monitoring system of claim 1, wherein the laser source is provided outside the semiconductor processing chamber and arranged to transmit the laser light through a window of the semiconductor processing chamber to the surface.

3. The monitoring system of claim 1, wherein the laser source is provided within the semiconductor processing chamber.

4. The monitoring system of claim 1, wherein the light detector is provided outside the semiconductor processing chamber and arranged to detect the fluorescence through a window of the semiconductor processing chamber.

5. The monitoring system of claim 1, wherein the light detector is provided within the semiconductor processing chamber.

6. The monitoring system of claim 1, wherein:
the light detector further comprises an ellipsometer configured to detect reflected laser light reflected from the surface, and
the computer module is further configured to analyze the reflected laser light and determine a property of the surface.

7. The monitoring system of claim 6, wherein the computer module is configured to determine a count of particles on the surface based on scattering of the reflected laser light.

8. The monitoring system of claim 1, wherein:
the semiconductor processing chamber comprises a plurality of windows, and
the laser source is optically coupled to a first window of the plurality of windows and the light detector is optically coupled to a second window of a plurality of windows such that specular reflection of the fluorescence is minimized.

9. The monitoring system of claim 1, further comprising torque pins configured to elevate the wafer such that the surface comprises a backside of the wafer.

10. The monitoring system of claim 1, further comprising a motorized device configured to move a position of at least one of the laser source and the light detector.

11. A method, comprising:
providing a laser light from a laser source incident on a surface including one selected from the group consisting of a surface of an electrostatic chuck (ESC) within a semiconductor processing chamber, a surface of an internal wall of the semiconductor processing chamber and a surface of a wafer contained in the semiconductor processing chamber to induce a fluorescence from the surface;
detecting the fluorescence from the surface on a light detector, wherein at least one of the providing the laser light and the detecting the fluorescence occurs outside of the semiconductor processing chamber; and
analyzing the fluorescence and determining a chemical characteristic of the surface based on the fluorescence.

12. The method of claim 11, wherein the laser light is generated outside of the semiconductor processing chamber and transmitted through a window of the semiconductor processing chamber to the surface.

13. The method of claim 11, wherein the fluorescence is detected through a window of the semiconductor processing chamber.

14. The method of claim 11, further comprising:
detecting a reflected laser light reflected from the surface, and
analyzing the reflected laser light and determining a property of the surface.

15. The method of claim 14, wherein the determining a property comprises determining a count of particles on the surface based on scattering of the reflected laser light.

16. The method of claim 11, further comprising elevating the wafer such that the surface comprises a backside of the wafer.

17. The method of claim 16, wherein the elevating comprises elevating the wafer using torque pins.

18. The method of claim 11, further comprising moving a position of at least one of the laser source and the light detector using a motorized device.

19. The method of claim 11, wherein the laser light is generated within the semiconductor processing chamber.

20. The method of claim 11, wherein the fluorescence is detected by the light detector positioned within the semiconductor processing chamber.

21. The method of claim 11, wherein the fluorescence is detected by the light detector positioned outside the semiconductor processing chamber through a window of the semiconductor processing chamber.

* * * * *